(12) United States Patent
Lau et al.

(10) Patent No.: US 12,309,943 B2
(45) Date of Patent: May 20, 2025

(54) CIRCUIT CARRIER AND MANUFACTURING METHOD THEREOF AND PACKAGE STRUCTURE

(71) Applicant: Unimicron Technology Corp., Taoyuan (TW)

(72) Inventors: John Hon-Shing Lau, Taoyuan (TW); Ra-Min Tain, Hsinchu County (TW); Cheng-Ta Ko, Taipei (TW); Tzyy-Jang Tseng, Taoyuan (TW); Chun-Hsien Chien, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 190 days.

(21) Appl. No.: 18/089,465

(22) Filed: Dec. 27, 2022

(65) Prior Publication Data

US 2023/0137841 A1 May 4, 2023

Related U.S. Application Data

(60) Continuation-in-part of application No. 17/219,898, filed on Apr. 1, 2021, now abandoned, which is a
(Continued)

(30) Foreign Application Priority Data

| Oct. 18, 2018 | (TW) | ................................. 107136704 |
| Jun. 6, 2019 | (TW) | ................................. 108119700 |
| Dec. 27, 2021 | (TW) | ................................. 110148855 |

(51) Int. Cl.
*H05K 1/11* (2006.01)
*H05K 1/02* (2006.01)
(Continued)

(52) U.S. Cl.
CPC ......... *H05K 3/4682* (2013.01); *H05K 1/0298* (2013.01); *H05K 1/115* (2013.01);
(Continued)

(58) Field of Classification Search
CPC .... H05K 3/4682; H05K 1/115; H05K 3/0047; H05K 3/4038; H05K 2201/09509;
(Continued)

(56) References Cited

U.S. PATENT DOCUMENTS

| 2009/0084596 | A1* | 4/2009 | Inoue | ...................... H01L 24/24 |
| | | | | 29/846 |
| 2015/0001738 | A1* | 1/2015 | Shimizu | ................. H05K 1/181 |
| | | | | 257/778 |

(Continued)

FOREIGN PATENT DOCUMENTS

| CN | 209627793 | 11/2019 |
| TW | 201815240 | 4/2018 |

*Primary Examiner* — Steven T Sawyer
(74) *Attorney, Agent, or Firm* — JCIPRNET

(57) ABSTRACT

A circuit carrier includes a substrate, a first build-up circuit structure, a second build-up circuit structure, a fine redistribution structure and at least one conductive through hole. The substrate has a top surface and a bottom surface opposite to each other. The first build-up circuit structure is disposed on the top surface of the substrate and electrically connected to the substrate. The second build-up circuit structure is disposed on the bottom surface of the substrate and electrically connected to the substrate. The fine redistribution structure is directly attached on the first build-up circuit structure, wherein a line width and a line spacing of the fine redistribution structure are smaller than those of the first build-up circuit structure. The conductive through hole penetrates the fine redistribution structure and a portion of
(Continued)

the first build-up circuit structure and is electrically connected to the fine redistribution structure and the first build-up circuit structure.

17 Claims, 9 Drawing Sheets

Related U.S. Application Data division of application No. 16/535,102, filed on Aug. 8, 2019, now Pat. No. 10,999,939, which is a continuation-in-part of application No. 16/244,113, filed on Jan. 10, 2019, now Pat. No. 10,888,001, application No. 18/089,465 is a continuation-in-part of application No. 17/674,837, filed on Feb. 18, 2022, now Pat. No. 11,690,173.

(60) Provisional application No. 63/213,667, filed on Jun. 22, 2021, provisional application No. 62/682,181, filed on Jun. 8, 2018.

(51) Int. Cl.
    *H05K 3/00*     (2006.01)
    *H05K 3/40*     (2006.01)
    *H05K 3/46*     (2006.01)

(52) U.S. Cl.
    CPC ......... *H05K 3/0047* (2013.01); *H05K 3/4038* (2013.01); *H05K 2201/09509* (2013.01)

(58) Field of Classification Search
    CPC ........... H05K 3/4697; H05K 2203/061; H05K 3/4688; H05K 1/0298
    See application file for complete search history.

(56) References Cited

U.S. PATENT DOCUMENTS

| | | | |
|---|---|---|---|
| 2015/0102510 A1* | 4/2015 | Kaneda | H05K 3/0052 174/250 |
| 2015/0181703 A1* | 6/2015 | Tanaka | H05K 1/0298 174/251 |
| 2015/0357276 A1* | 12/2015 | Shimizu | H05K 3/0055 361/783 |
| 2016/0095219 A1* | 3/2016 | Sakamoto | H01L 24/81 361/767 |
| 2016/0172287 A1* | 6/2016 | Arisaka | H05K 1/181 257/774 |
| 2020/0279814 A1* | 9/2020 | Huang | H01L 21/486 |
| 2021/0219435 A1 | 7/2021 | Chien | |

\* cited by examiner

CIRCUIT CARRIER AND MANUFACTURING METHOD THEREOF AND PACKAGE STRUCTURE

CROSS-REFERENCE TO RELATED APPLICATION

This application is a continuation-in-part application of and claims the priority benefit of U.S. application Ser. No. 17/219,898, filed on Apr. 1, 2021, now pending. The prior U.S. application Ser. No. 17/219,898 is a divisional application of and claims the priority benefit of U.S. application Ser. No. 16/535,102, filed on Aug. 8, 2019, now patented, which claims the priority benefit of Taiwan application serial no. 108119700, filed on Jun. 6, 2019. The prior U.S. application Ser. No. 16/535,102 is a continuation-in-part application of and claims the priority benefit of U.S. application Ser. No. 16/244,113, filed on Jan. 10, 2019, now patented. The prior U.S. application Ser. No. 16/244,113 claims the priority benefit of U.S. provisional application Ser. No. 62/682,181, filed on Jun. 8, 2018, and Taiwan application serial no. 107136704, filed on Oct. 18, 2018. This application is also a continuation-in-part application of and claims the priority benefit of U.S. application Ser. No. 17/674,837, filed on Feb. 18, 2022, now pending. The prior U.S. application Ser. No. 17/674,837 claims the priority benefits of U.S. provisional application Ser. No. 63/213,667, filed on Jun. 22, 2021, and Taiwan application serial no. 110148855, filed on Dec. 27, 2021. The entirety of each of the above-mentioned patent applications is hereby incorporated by reference herein and made a part of this specification.

BACKGROUND

Technical Field

The present invention relates to a circuit carrier and a manufacturing method thereof, and a package structure, and more particularly to a circuit carrier with at least one conductive through hole that electrically connects to different line widths and line spacing and a manufacturing method thereof and a package structure having the above circuit carrier.

Description of Related Art

In general, the multilayer circuit structure of a circuit board is mostly manufactured by a build-up method or a laminated method, and thus has the features of high circuit density and reduced circuit spacing. For example, the multilayer circuit structure is formed by combining a copper foil and a PrePreg into a build-up layer structure and stacking the build-up layer structure on a core layer via repeated lamination to increase the internal wiring space of the multilayer circuit structure, wherein the conductive material on the build-up layer structure may form conductive circuits according to the required circuit layout, and the blind vias or through-holes of the build-up layer structure may be additionally filled with a conductive material to conduct each of the layers. Thus, the multilayer circuit structure may be manufactured by adjusting the number of circuit structures according to requirements and via the above method.

With the advancement of technology, all kinds of electronic products are developed to have high speed, high efficiency, and be compact. Under this trend, how to simplify the manufacturing process of circuit boards with high-density circuit layers and improve production yields are urgent problems to be solved in the field.

SUMMARY

The invention provides a circuit carrier, which meets a current trend of low-cost, high-density, and low signal loss through heterogeneous integration characteristics.

The invention also provides a package structure, which adopts the aforementioned circuit carrier to achieve high performance, high bandwidth and better structural reliability.

The invention also provides a manufacturing method of a circuit carrier to manufacture the circuit carrier.

The invention provides a circuit carrier including a substrate, a first build-up circuit structure, a second build-up circuit structure, a fine redistribution structure and at least one conductive through hole. The substrate has a top surface and a bottom surface opposite to each other. The first build-up circuit structure is disposed on the top surface of the substrate and electrically connected to the substrate. The second build-up circuit structure is disposed on the bottom surface of the substrate and electrically connected to the substrate. The fine redistribution structure is directly attached on the first build-up circuit structure, wherein a line width and a line spacing of the fine redistribution structure are smaller than a line width and a line spacing of the first build-up circuit structure. The conductive through hole penetrates the fine redistribution structure and a portion of the first build-up circuit structure and is electrically connected to the fine redistribution structure and the first build-up circuit structure.

In an embodiment of the invention, the substrate further includes a core layer, a first circuit layer, a second circuit layer and at least one conductive via. The core layer has the top surface and the bottom surface. The first circuit layer is disposed on the top surface, wherein the first build-up circuit structure is electrically connected to the first circuit layer. The second circuit layer is disposed on the bottom surface, wherein the second build-up circuit structure is electrically connected to the second circuit layer. The conductive via penetrates the core layer and is electrically connected to the first circuit layer and the second circuit layer.

In an embodiment of the invention, the substrate is a dielectric substrate, and further includes at least one through cavity penetrating the dielectric substrate and connecting the top surface and the bottom surface, at least one through hole, at least one conductive through hole, and a dielectric material layer. The through hole penetrates through the dielectric substrate. An aperture of the through cavity is greater than an aperture of the through hole. The conductive through hole is disposed in the through hole, and the dielectric material layer is disposed in the through hole to fill a gap between the conductive through hole and the dielectric substrate.

In an embodiment of the invention, the circuit carrier further includes at least one embedded block, at least one electronic component and at least one conductive via. The embedded block is fixed in the through cavity, wherein the embedded block includes an upper surface and a lower surface opposite to each other, at least one opening, and at least one via penetrating through the embedded block and connecting the upper surface and the lower surface. The electronic component is disposed in the opening of the embedded block, wherein the first build-up circuit structure is electrically connected with the electronic component. The conductive via is disposed in the via of the embedded block and electrically connecting the first build-up circuit structure and the second build-up circuit structure.

In an embodiment of the invention, the circuit carrier further includes a dielectric material, wherein the opening of the embedded block is at least one through hole. The dielectric material is filled in the via and the through hole, and covers the conductive via located in the via and the electronic component located in the through hole.

In an embodiment of the invention, the first build-up circuit structure includes a plurality of dielectric layers, a plurality of circuit layers and a plurality of via holes. The plurality of dielectric layers and the plurality of circuit layers are alternately stacked. The plurality of via holes are electrically connected to two adjacent circuit layers of the plurality of circuit layers. The plurality of circuit layers are electrically connected to the substrate through the plurality of via holes. The conductive through hole is electrically connected to a plurality of pads of the fine redistribution structure and an outmost circuit layer of the plurality of circuit layers. At least one layer of the dielectric layers is a photosensitive dielectric layer or an Ajinomoto build-up film.

In an embodiment of the invention, the second build-up circuit structure includes a plurality of dielectric layers, a plurality of circuit layers and a plurality of via holes. The plurality of dielectric layers and the plurality of circuit layers are alternately stacked. The plurality of via holes are electrically connected to two adjacent circuit layers of the plurality of circuit layers. The plurality of circuit layers are electrically connected to the substrate through the plurality of via holes.

In an embodiment of the invention, the circuit carrier further includes a solder mask layer and a plurality of solder balls. The solder mask layer is disposed on the second build-up circuit structure, covers an outmost dielectric layer of the plurality of dielectric layers and exposes a portion of an outmost circuit layer of the plurality of circuit layers. The plurality of solder balls is disposed on the outmost circuit layer exposed by the solder mask layer.

In an embodiment of the invention, the fine redistribution structure includes a plurality of redistribution circuits, a plurality of via holes, a plurality of dielectric layers, and a plurality of pads. The plurality of redistribution circuits and the plurality of dielectric layers are alternately stacked. The plurality of via holes are electrically connected to adjacent two redistribution circuits of the plurality of redistribution circuits. The plurality of pads are electrically connected to the plurality of redistribution circuits through the plurality of via holes, and at least one layer of the dielectric layers is a photosensitive dielectric layer.

In an embodiment of the invention, the line width and the line spacing of the fine redistribution structure are respectively less than 2 micrometer.

The invention provides a package structure including a circuit carrier and at least one chip. The circuit carrier includes a substrate, a first build-up circuit structure, a second build-up circuit structure, a fine redistribution structure and at least one conductive through hole. The substrate has a top surface and a bottom surface opposite to each other. The first build-up circuit structure is disposed on the top surface of the substrate and electrically connected to the substrate. The second build-up circuit structure is disposed on the bottom surface of the substrate and electrically connected to the substrate. The fine redistribution structure is directly attached on the first build-up circuit structure, wherein a line width and a line spacing of the fine redistribution structure are smaller than a line width and a line spacing of the first build-up circuit structure. The conductive through hole penetrates the fine redistribution structure and a portion of the first build-up circuit structure and is electrically connected to the fine redistribution structure and the first build-up circuit structure. The chip is attached on the fine redistribution structure of the circuit carrier and electrically connected to the circuit carrier.

In an embodiment of the invention, the package structure further includes a plurality of solder balls and an underfill. The solder balls are disposed between the chip and the fine redistribution structure. The underfill is disposed between the chip and the fine redistribution structure and covering the plurality of solder balls.

The invention provides a manufacturing method of a circuit carrier includes the following. A fine redistribution structure is formed on a temporary substrate. A build-up package substrate is provided, wherein the build-up package substrate includes a substrate, a first build-up circuit structure, and a second build-up circuit structure. The substrate has a top surface and a bottom surface opposite to each other. The first build-up circuit structure is disposed on the top surface of the substrate and electrically connected to the substrate. The second build-up circuit structure is disposed on the bottom surface of the substrate and electrically connected to the substrate. The fine redistribution structure is bonded on the build-up package substrate, wherein the fine redistribution structure is directly attached on the first build-up circuit structure, wherein a line width and a line spacing of the fine redistribution structure are smaller than a line width and a line spacing of the first build-up circuit structure. The temporary substrate is removed. At least one conductive through hole is formed to penetrate the fine redistribution structure and a portion of the first build-up circuit structure and electrically connect to the fine redistribution structure and the first build-up circuit structure.

In an embodiment of the invention, the manufacturing method of the circuit carrier further includes a solder mask layer is formed on the second build-up circuit structure before the fine redistribution structure bonding on the build-up package substrate, wherein the solder mask layer exposes a portion of an outmost circuit layer of the second build-up circuit structure; and a plurality of solder balls is formed on the outmost circuit layer of the second build-up circuit structure exposed by the solder mask layer after forming the conductive through hole.

In summary, in the design of the circuit carrier of the invention, the fine redistribution structure is directly attached on the first build-up circuit structure, wherein a line width and a line spacing of the fine redistribution structure are smaller than a line width and a line spacing of the first build-up circuit structure, and the conductive through hole penetrates the fine redistribution structure and a portion of the first build-up circuit structure and is electrically connected to the fine redistribution structure and the first build-up circuit structure. Accordingly, with the circuit carrier in the invention, no connection structure is required between the first build-up circuit structure and the fine redistribution structure, so the manufacturing cost of the circuit board can be effectively reduced, and the module density may be improved. Furthermore, the conductive through hole can electrically connected the thick circuit structure (i.e. first build-up circuit structure) and the thin circuit structure (i.e. fine redistribution structure), thereby reducing the loss of the signal. Therefore, the circuit carrier of the invention meets a current trend of low-cost, high-density, and low signal loss through heterogeneous integration characteristics. In addition, the package structure including the aforementioned circuit carrier can achieve high performance, high bandwidth and better structural reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
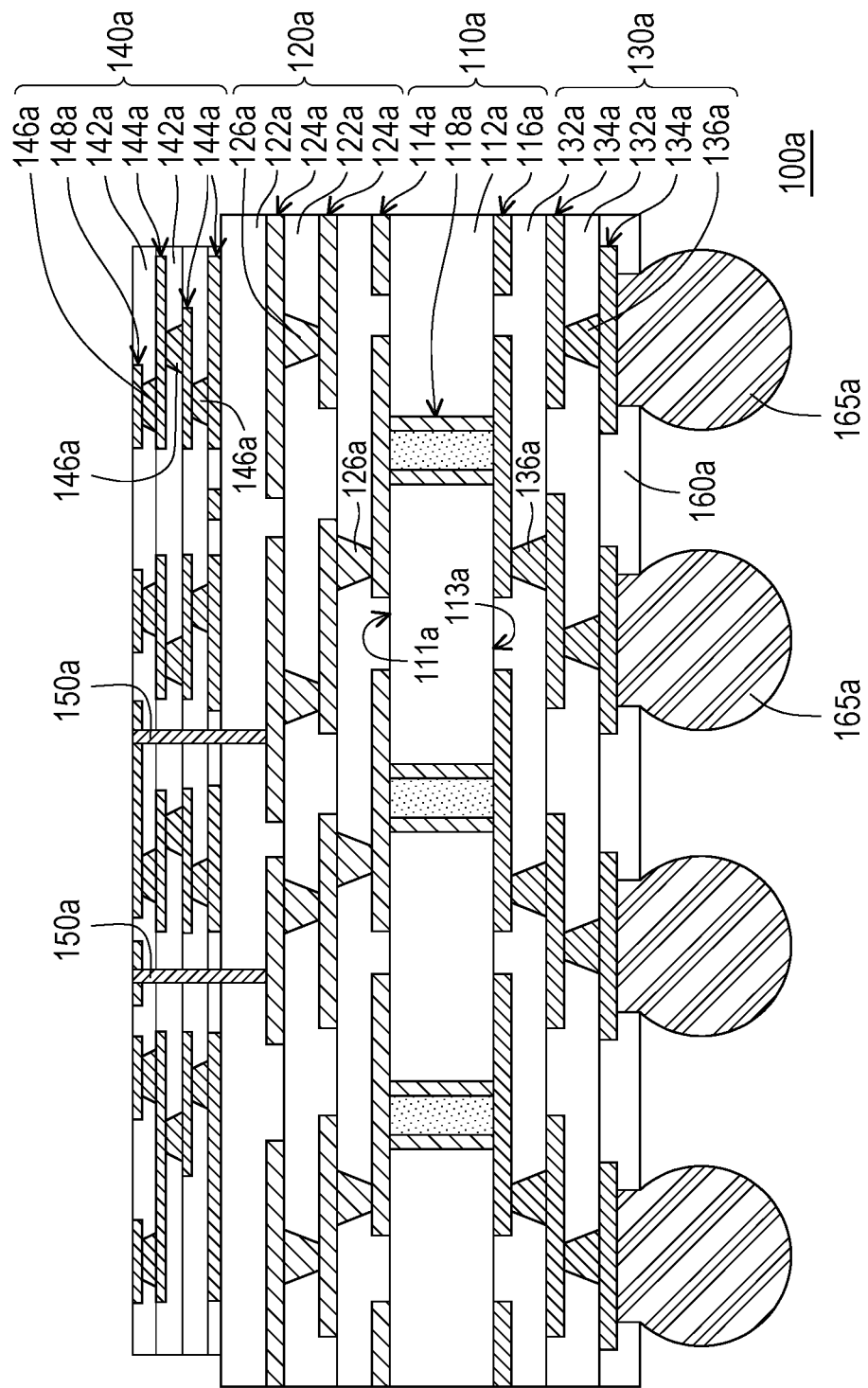
FIG. 1 is a schematic cross-sectional view of a circuit carrier according to an embodiment of the invention.

FIG. 1 is a schematic cross-sectional view of a circuit carrier according to an embodiment of the invention. Referring to FIG. 1, in this embodiment, the circuit carrier 100a includes a substrate 110a, a first build-up circuit structure 120a, a second build-up circuit structure 130a, a fine redistribution structure 140a and at least one conductive through hole 150a. The substrate 110a has a top surface 111a and a bottom surface 113a opposite to each other. The first build-up circuit structure 120a is disposed on the top surface 111a of the substrate 110a and electrically connected to the substrate 110a. The second build-up circuit structure 130a is disposed on the bottom surface 113a of the substrate 110a and electrically connected to the substrate 110a. The fine redistribution structure 140a is directly attached on the first build-up circuit structure 120a, wherein a line width and a line spacing of the fine redistribution structure 140a are smaller than a line width and a line spacing of the first build-up circuit structure 130a. The conductive through holes 150a penetrate the fine redistribution structure 140a and a portion of the first build-up circuit structure 120a and is electrically connected to the fine redistribution structure 140a and the first build-up circuit structure 120a.

In detail, in this embodiment, the substrate 110a further includes a core layer 112a, a first circuit layer 114a, a second circuit layer 116a and at least one conductive via 118a. The core layer 112a has the top surface 111a and the bottom surface 113a. The first circuit layer 114a is disposed on the top surface 111a, wherein the first build-up circuit structure 120a is electrically connected to the first circuit layer 114a. The second circuit layer 116a is disposed on the bottom surface 113a, wherein the second build-up circuit structure 130a is electrically connected to the second circuit layer 116a. The conductive via 118a penetrates the core layer 112a and is electrically connected to the first circuit layer 114a and the second circuit layer 116a.

The first build-up circuit structure 120a includes a plurality of dielectric layers 122a, a plurality of circuit layers 124a and a plurality of via holes 126a. The plurality of dielectric layers 122a and the plurality of circuit layers 124a are alternately stacked. The plurality of via holes 126a are electrically connected to two adjacent circuit layers 124a. The plurality of circuit layers 124a are electrically connected to the first circuit layer 114a of the substrate 110a through the plurality of via holes 126a. In an embodiment, at least one layer of the dielectric layers 122a is a photosensitive dielectric layer. For example, the outmost dielectric layer 122a closest to the fine redistribution structure 140a can be a photosensitive dielectric layer, or an Ajinomoto build-up film (ABF). Herein, the disclosure does not limit the number of layers of the dielectric layers 122a and the circuit layers 124a.

The second build-up circuit structure 130a includes a plurality of dielectric layers 132a, a plurality of circuit layers 134a and a plurality of via holes 136a. The plurality of dielectric layers 132a and the plurality of circuit layers 134a are alternately stacked. The plurality of via holes 136a are electrically connected to two adjacent circuit layers 134a. The plurality of circuit layers 134a are electrically connected to the second layer 116a of the substrate 110a through the plurality of via holes 136a. Herein, the disclosure does not limit the number of layers of the dielectric layers 132a and the circuit layers 134a.

Furthermore, the fine redistribution structure 140a is directly attached on the first build-up circuit structure 120a, and there is no connecting structure, for example, the underfill and/or solder balls, between the fine redistribution structure 140a and the first build-up circuit structure 120a. The fine redistribution structure 140a includes a plurality of dielectric layers 142a, a plurality of redistribution circuits 144a, a plurality of via holes 146a, and a plurality of pads 148a. The plurality of redistribution circuits 144a and the plurality of dielectric layers 142a are alternately stacked. The plurality of via holes 146a are electrically connected to adjacent two redistribution circuits 144a. The plurality of pads 148a are electrically connected to the plurality of redistribution circuits 144a through the plurality of via holes 146a, and at least one layer of the dielectric layers 142a is a photosensitive dielectric layer. That is, the four-layer dielectric layer 142a in FIG. 1 may all be photosensitive dielectric layers, or some may be photosensitive dielectric layers, and the rest may be non-photosensitive dielectric layers. In an embodiment, a line width and line spacing of fine redistribution structure 140a may be, for example, less than 8 micrometers. In an embodiment, a minimum line width and line spacing of the fine redistribution structure 140a may be less than 1 micrometer. In other words, the redistribution circuits 144a are fine line. The conductive through holes 150a penetrate the dielectric layers 142a of the fine redistribution structure 140a and the outmost dielectric layer 122a of the first build-up circuit structure 120a, and the conductive through holes 150a are electrically connected to the pads 148a of the fine redistribution structure 140a and an outmost circuit layer 124a of the first build-up circuit structure 120a. Herein, a material of the conductive through hole 150a, for example, copper, but not limited thereto.

In addition, the circuit carrier 100a further includes a solder mask layer 160a and a plurality of solder balls 165a. The solder mask layer 160a is disposed on the second build-up circuit structure 130a, covers an outmost dielectric layer 132a and exposes a portion of an outmost circuit layer 134a. The plurality of solder balls 165a is disposed on the outmost circuit layer 134a exposed by the solder mask layer 160a.

Since the fine redistribution structure 140a is directly attached on the first build-up circuit structure 120a, and the conductive through holes 150a penetrate the fine redistribution structure 140a and a portion of the first build-up circuit structure 120a and is electrically connected to the fine redistribution structure 140a and the first build-up circuit structure 120a, no connection structure is required between the first build-up circuit structure 120a and the fine redistribution structure 140a, so the manufacturing cost of the circuit board 100a can be effectively reduced, and the module density may be improved. Furthermore, the conductive through holes 150a can electrically connected the thick circuit structure (i.e. first build-up circuit structure 120a) and the thin circuit structure (i.e. fine redistribution structure 140a), thereby reducing the loss of the signal. Therefore, the circuit carrier 100a of the present embodiment meets a current trend of low-cost, high-density, and low signal loss through heterogeneous integration characteristics.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
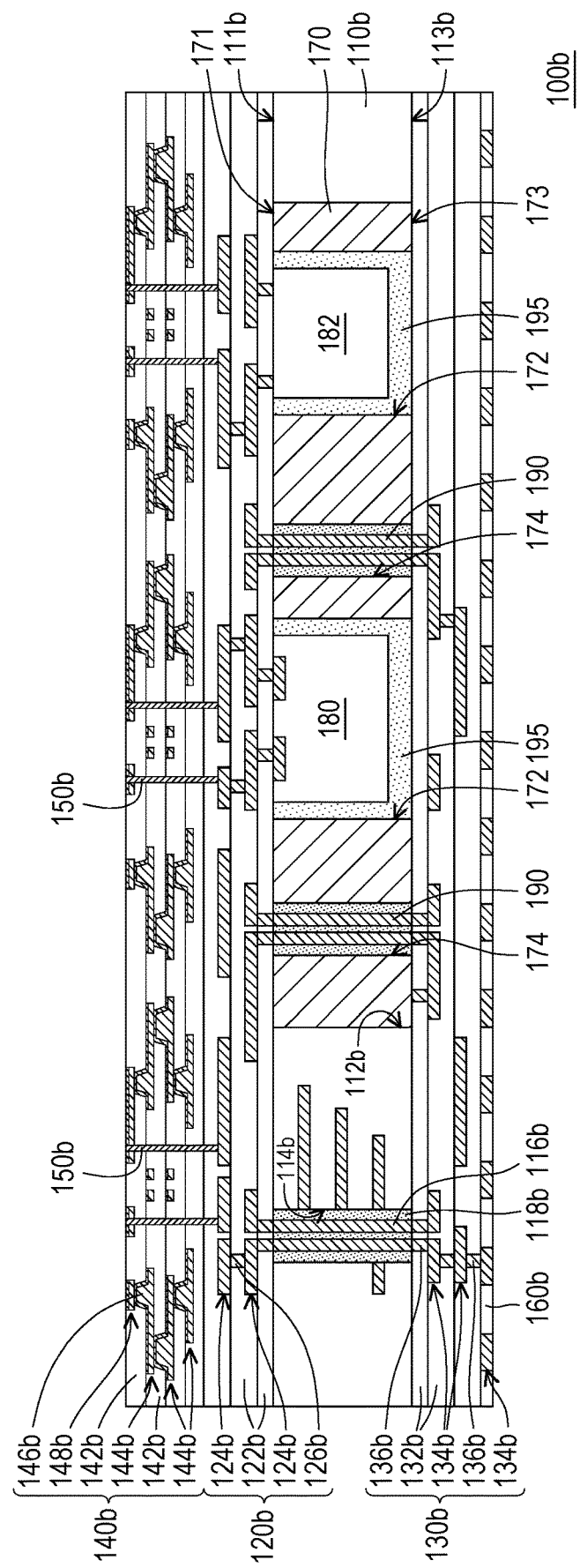
FIG. 2 is a schematic cross-sectional view of a circuit carrier according to another embodiment of the invention.

FIG. 2 is a schematic cross-sectional view of a circuit carrier according to another embodiment of the invention. With reference to both FIG. 1 and FIG. 2, the circuit carrier 100b of this embodiment is similar to the circuit carrier 100a of FIG. 1, and the main difference between the two is that in this embodiment, the structure of the substrate 110b is difference from the structure of the substrate 110a. In more detail, the substrate 110b is a dielectric substrate, and further includes at least one through cavity 112b penetrating the dielectric substrate 110b and connecting the top surface 111b and the bottom surface 113b, at least one through hole 114b, at least one conductive through hole 116b, and a dielectric material layer 118b. The through hole 114b penetrates through the dielectric substrate 110b. An aperture of the through cavity 112b is greater than an aperture of the through hole 114b. The conductive through hole 116b is disposed in the through hole 114b, and the dielectric material layer 118b is disposed in the through hole 114b to fill a gap between the conductive through hole 116b and the dielectric substrate 110b. In an embodiment, the material of the dielectric substrate 110b may include epoxy glass cloth with flame retardant and self-extinguishing properties (FR-4) or BT resin (bismaleimide triazine resin), but not limited thereto.

Furthermore, the circuit carrier 100b further includes at least one embedded block 170, at least one electronic component 180, 182 and at least one conductive via 190. The embedded block 170 is fixed in the through cavity 112b, wherein the embedded block 170 includes an upper surface 171 and a lower surface 173 opposite to each other, at least one opening 172, and at least one via 174 penetrating through the embedded block 170 and connecting the upper surface 171 and the lower surface 173. The upper surface 171 of the embedded block 170 may be substantially flush with the top surface 111b of the dielectric substrate 110b. The lower surface 173 of the embedded block 170 may be substantially flush with the bottom surface 113b of the dielectric substrate 110b, but not limited thereto. In an embodiment, the embedded block 170 may be made of conductive material, so that the heat generated by the electronic components 180, 182 may be transferred through the embedded block 170, thereby improving the overall heat-dissipation effect. The conductive material may include metal (e.g., copper), alloy, or metal mixed with non-metal material. In an embodiment, the embedded block 170 may be made of non-metal material, such as diamond or graphene, but not limited thereto. In an embodiment, the embedded block 170 may be made of a non-conductive material. The non-conductive material may include glass, ceramic, or other organic materials, but not limited thereto.

The electronic components 180, 182 are disposed in the openings 172 of the embedded block 170, wherein the first build-up circuit structure 120b is electrically connected with the electronic components 180, 182. The electronic components 180, 182 may be active elements and/or passive elements. The conductive vias 190 are disposed in the vias 174 of the embedded block 170 and electrically connecting the first build-up circuit structure 120b and the second build-up circuit structure 130b. In an embodiment, the conductive vias 190 may be surrounded by the embedded block 170 including conductive material, so that the signals of the conductive vias 190 may be protected from being disturbed by noise, thereby reducing the loss of the signal and improving the signal integrity. The material of the conductive vias 190 is, for example, copper, but not limited thereto.

In addition, the circuit carrier 100b further includes a dielectric material 195, wherein the opening 172 of the embedded block 170 is at least one through hole. The dielectric material 195 is filled in the via 174 and the through hole 172, and covers the conductive via 190 located in the via 174 and the electronic component 180, 182 located in the through hole 172. If the embedded block 170 includes conductive material, the disposition of the dielectric material 195 may avoid short circuit between the conductive vias 190 and the embedded block 170. The dielectric material 195 may include prepreg or gel, but not limited thereto. In an embodiment, the conductive vias 190, the embedded block 170 including conductive material, and the dielectric material 195 may form a coaxial via.

The first build-up circuit structure 120b includes a plurality of dielectric layers 122b, a plurality of circuit layers 124b and a plurality of via holes 126b. The plurality of via holes 126b are electrically connected to two adjacent circuit layers 124b. The plurality of circuit layers 124b are electrically connected to the conductive through hole 116b and the conductive vias 190 of the substrate 110b through the plurality of via holes 126b. The outmost dielectric layer 122b closest to the fine redistribution structure 140b can be a photosensitive dielectric layer, or an Ajinomoto build-up film (ABF). The second build-up circuit structure 130b includes a plurality of dielectric layers 132b, a plurality of circuit layers 134b and a plurality of via holes 136b. The plurality of via holes 136b are electrically connected to two adjacent circuit layers 134b. The plurality of circuit layers 134b are electrically connected to the conductive through hole 116b and the conductive vias 190 of the substrate 110b through the plurality of via holes 136b.

Furthermore, the fine redistribution structure 140b is directly attached on the first build-up circuit structure 120b, and there is no connecting structure, for example, the underfill, the adhesive layer and/or solder balls, between the fine redistribution structure 140b and the first build-up circuit structure 120b. The fine redistribution structure 140b includes a plurality of dielectric layers 142b, a plurality of redistribution circuits 144b, a plurality of via holes 146b, and a plurality of pads 148b. The plurality of via holes 146b are electrically connected to adjacent two redistribution circuits 144b. The plurality of pads 148b are electrically connected to the plurality of redistribution circuits 144b through the plurality of via holes 146b, and a minimum line width and line spacing of the fine redistribution structure 140b may be less than 1 micrometer. The conductive through holes 150b penetrate the dielectric layers 142b of the fine redistribution structure 140b and the outmost dielectric layer 122b of the first build-up circuit structure 120b, and the conductive through holes 150b are electrically connected to the pads 148b of the fine redistribution structure 140b and an outmost circuit layer 124b of the first build-up circuit structure 120b. The solder mask layer 160b is disposed on the second build-up circuit structure 130b, and exposes an outmost circuit layer 134b.

Figure 3:
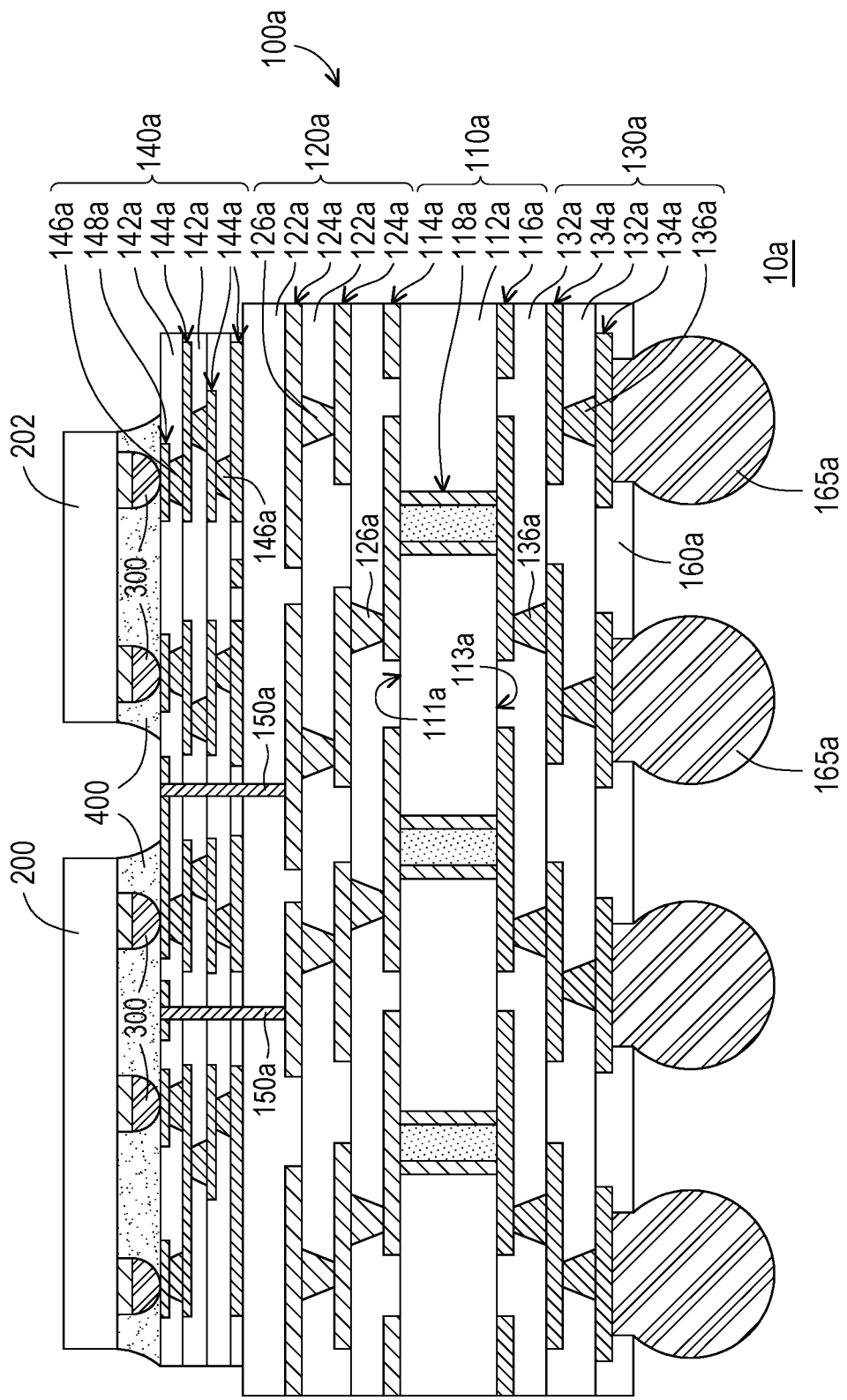
FIG. 3 is a schematic cross-sectional view of a package structure according to an embodiment of the invention.

FIG. 3 is a schematic cross-sectional view of a package structure according to an embodiment of the invention. Referring to FIG. 3, in this embodiment, a package structure 10a includes at least one chip 200, 202, and for example, the circuit carrier 100a shown in FIG. 1, wherein the chips 200, 202 are bonded (attached) on the fine redistribution structure 140a of the circuit carrier 100a and electrically connected to the circuit carrier 100a. The package structure 10a further includes a plurality of conductive terminals 300 and an underfill 400. The conductive terminals 300 are disposed between the chips 200, 202 and the fine redistribution structure 140a. The chips 200, 202 are electrically connected to the circuit carrier 100a by flip-chip bonding through the conductive terminals 300. Herein, the conductive terminals 300 are micro-bumps, but not limited thereto. The underfill 400 is disposed between the chips 200, 202 and the fine redistribution structure 140a and covering the plurality of conductive terminals 300.

Figure 4:
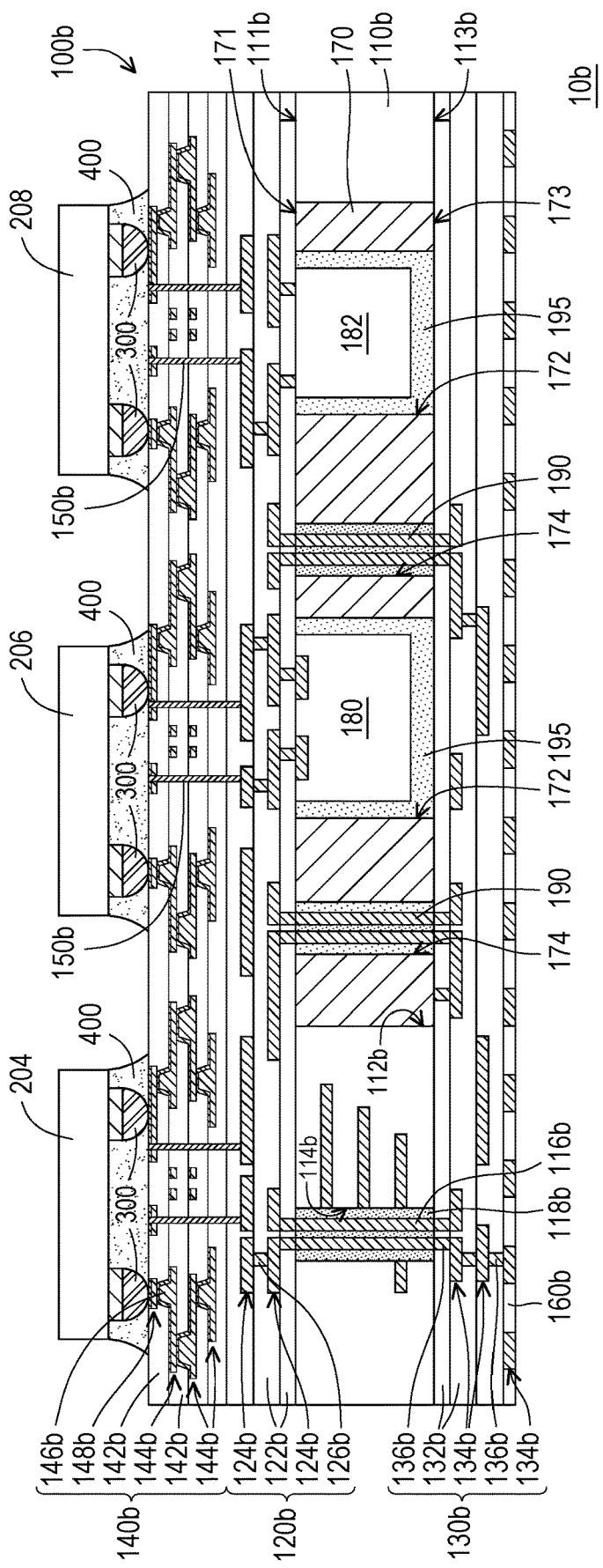
FIG. 4 is a schematic cross-sectional view of a package structure according to another embodiment of the invention.

FIG. 4 is a schematic cross-sectional view of a package structure according to another embodiment of the invention. Referring to FIG. 4, in this embodiment, a package structure 10b includes at least one chip 204, 206, 208, and for example, the circuit carrier 100b shown in FIG. 2, wherein the chips 204, 206, 208 are disposed on the fine redistribution structure 140b of the circuit carrier 100b and electrically connected to the circuit carrier 100b. The package structure 10b further includes a plurality of conductive terminals 300 and an underfill 400. The conductive terminals 300 are disposed between the chips 204, 206, 208 and the fine redistribution structure 140b. The chips 204, 206, 208 are electrically connected to the circuit carrier 100b by flip-chip bonding through the conductive terminals 300. Herein, the conductive terminals 300 are micro-bumps, but not limited thereto. The underfill 400 is disposed between the chips 204, 206, 208 and the fine redistribution structure 140b and covering the plurality of conductive terminals 300.

The circuit carrier 100a in FIG. 1 is described above, while a manufacturing method of a circuit carrier is not yet introduced in the present application. An exemplary embodiment is therefore provided along with FIGS. 5A to 5E to elaborate the manufacturing method of the circuit carrier 100a.

FIG. 5A to FIG. 5E are schematic cross-sectional diagrams of a manufacturing method of a circuit carrier according to an embodiment of the disclosure. In the manufacturing method of the circuit carrier 100a according to the embodiment, referring to FIG. 5A, the fine redistribution structure 140a is formed on a temporary substrate 10, wherein there is a released layer 12 between the fine redistribution structure 140 and the temporary substrate 10. Here, the material of the temporary substrate 10 is, for example, glass or plastic, and the temporary substrate 10 is a substrate without circuit. Next, referring to FIG. 5B, a build-up package substrate BL is provided, wherein the build-up package substrate BL includes the substrate 110a, the first build-up circuit structure 120a, and the second build-up circuit structure 130a. The substrate 110a has the top surface 111a and the bottom surface 113a opposite to each other. The first build-up circuit structure 120a is disposed on the top surface 111a of the substrate 110a and electrically connected to the substrate 110a. The second build-up circuit structure 130a is disposed on the bottom surface 113a of the substrate 110a and electrically connected to the substrate 110a. And then, the solder mask layer 160a is formed on the second build-up circuit structure 130a, wherein the solder mask layer 160a exposes a portion of the outmost circuit layer 134a of the second build-up circuit structure 130a.

Figure 5A:
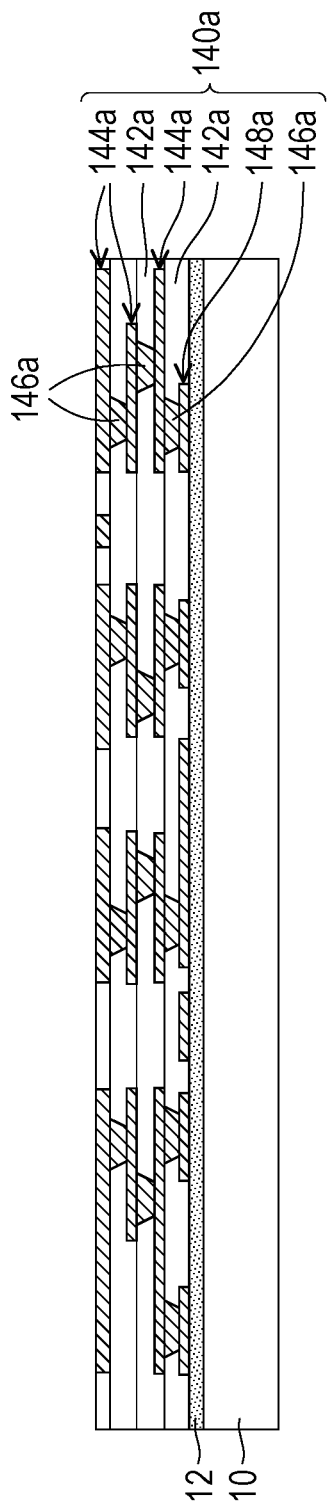
FIG. 5A to FIG. 5E are schematic cross-sectional diagrams of a manufacturing method of a circuit carrier according to an embodiment of the disclosure.
Figure 5B:
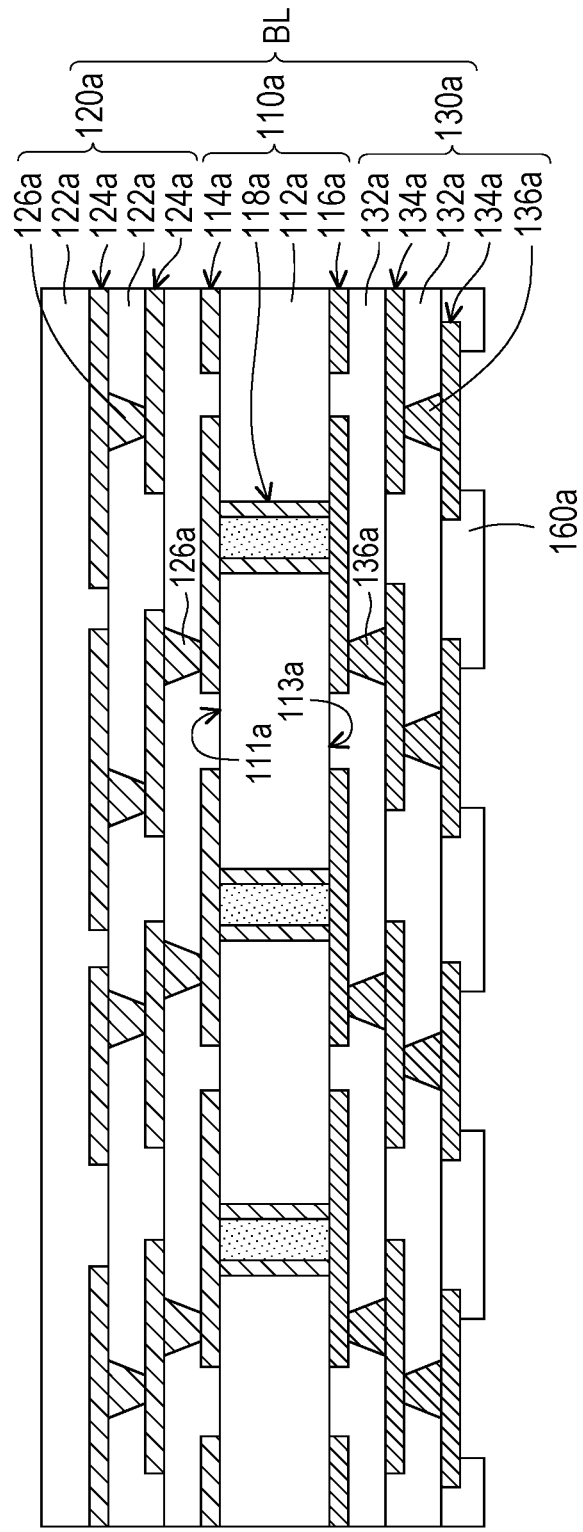
Figure 5C:
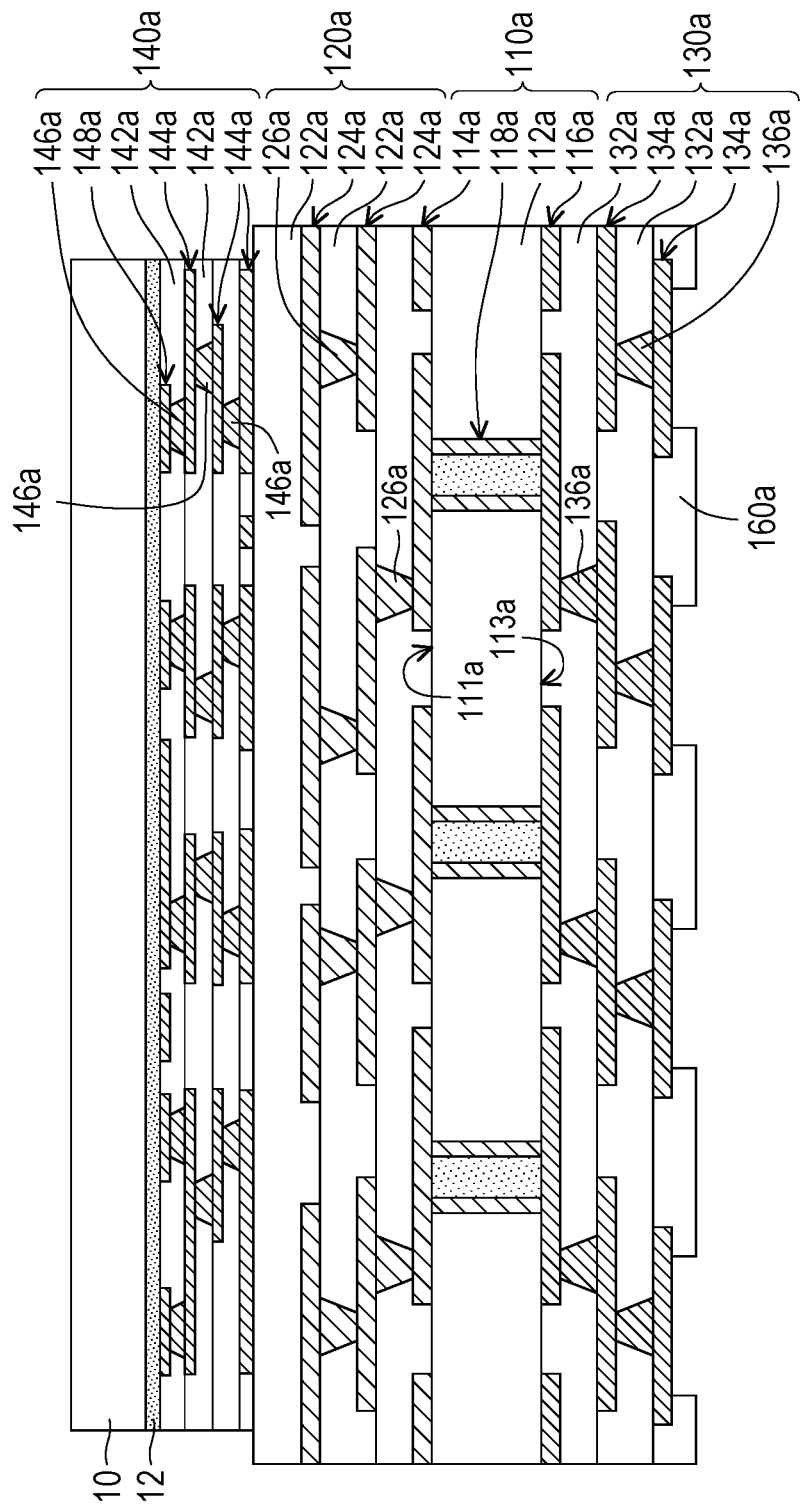
Figure 5D:
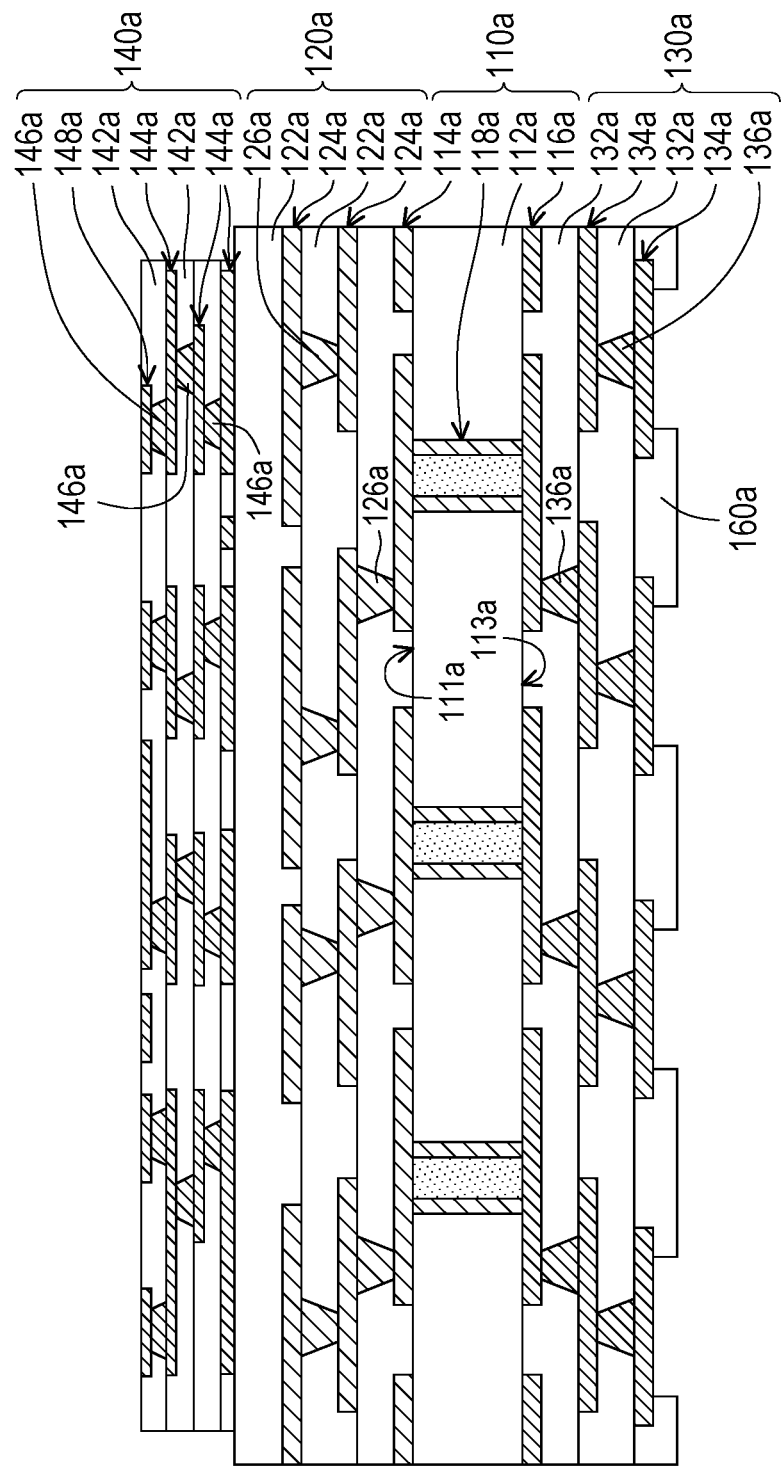
Figure 5E:
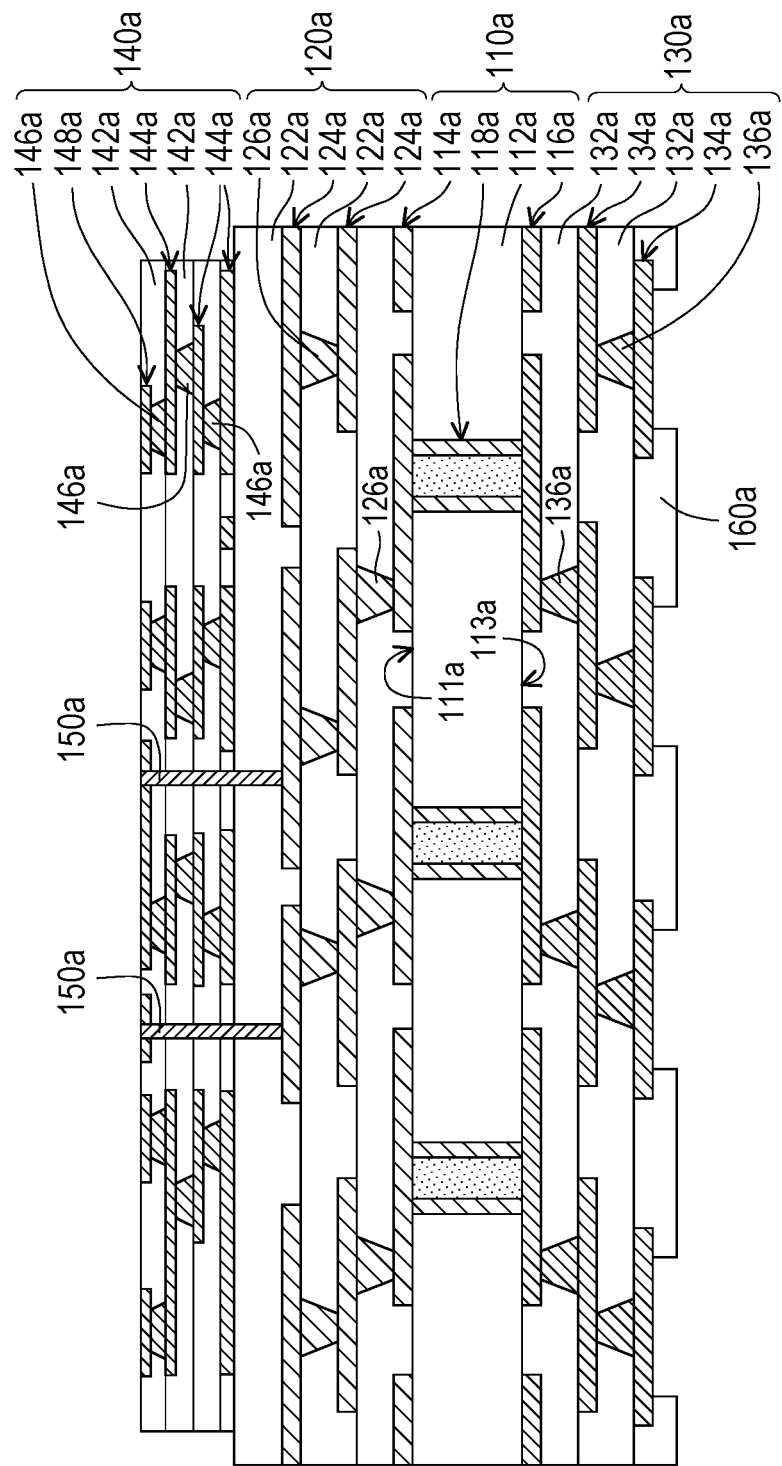

Next, referring to FIG. 5C, the fine redistribution structure 140a and the temporary substrate 10 are flipped and bonded to the build-up package substrate BL. The temporary substrate 10, the released layer 12, the fine redistribution structure 140a and the build-up package substrate BL are pressed together by hot pressing, so that the fine redistribution structure 140a is bonded on the build-up package substrate BL. Particularly, the fine redistribution structure 140a is directly attached on the first build-up circuit structure 120a. Next, referring to FIG. 5D, the temporary substrate 10 is removed by separating the temporary substrate 10 from the fine redistribution structure 140a by a laser. After that, referring to FIG. 5E, the conductive through hole 150a are formed to penetrate the fine redistribution structure 140a and a portion of the first build-up circuit structure 120a and electrically connect to the fine redistribution structure 140a and the first build-up circuit structure 120a. Here, the conductive through hole 150a penetrates the outmost pads 148a and the dielectric layers 142a of the fine redistribution structure 140a and the outmost dielectric layer 122a of the first build-up circuit structure 120a and electrically connect to the pads 148a the fine redistribution structure 140a and the circuit layer 124a of the first build-up circuit structure 120a. Finally, referring to FIG. 1 again, the solder balls 165a are formed on the outmost circuit layer 134a of the second build-up circuit structure 130a exposed by the solder mask layer 160a. So far, the manufacturing of the circuit carrier 100a has been completed.

To sum up, in the design of the circuit carrier of the invention, the fine redistribution structure is directly attached on the first build-up circuit structure, wherein a line width and a line spacing of the fine redistribution structure are smaller than a line width and a line spacing of the first build-up circuit structure, and the conductive through hole penetrates the fine redistribution structure and a portion of the first build-up circuit structure and is electrically connected to the fine redistribution structure and the first build-up circuit structure. Accordingly, with the circuit carrier in the invention, no connection structure is required between the first build-up circuit structure and the fine redistribution structure, so the manufacturing cost of the circuit board can be effectively reduced, and the module density may be improved. Furthermore, the conductive through hole can electrically connected the thick circuit structure (i.e. first build-up circuit structure) and the thin circuit structure (i.e. fine redistribution structure), thereby reducing the loss of the signal. Therefore, the circuit carrier of the invention meets a current trend of low-cost, high-density, and low signal loss through heterogeneous integration characteristics. In addition, the package structure including the aforementioned circuit carrier can achieve high performance, high bandwidth and better structural reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit carrier, comprising: a substrate, having a top surface and a bottom surface opposite to each other, wherein the substrate is a dielectric substrate, and further comprises at least one through cavity penetrating the dielectric substrate and connecting the top surface and the bottom surface, at least one first through hole, at least one first conductive through hole, and a dielectric material layer, the at least one first through hole penetrates through the dielectric substrate, an aperture of the at least one through cavity is greater than an aperture of the at least one first through hole, the at least one first conductive through hole is disposed in the at least one first through hole, and the dielectric material layer is disposed in the at least one first through hole to fill a gap between the at least one first conductive through hole and the dielectric substrate; a first build-up circuit structure, disposed on the top surface of the substrate and electrically connected to the substrate; a second build-up circuit structure, disposed on the bottom surface of the substrate and electrically connected to the substrate; a fine redistribution structure, directly attached on the first build-up circuit structure, wherein a line width and a line spacing of the fine redistribution structure are smaller than a line width and a line spacing of the first build-up circuit structure; at least one second conductive through hole, penetrating the fine redistribution structure and a portion of the first build-up circuit structure and electrically connected to the fine redistribution structure and the first build-up circuit structure; and at least one embedded block, fixed in the at least one through cavity, wherein the at least one embedded block comprises an upper surface and a lower surface opposite to each other, at least one opening, and at least one via penetrating through the at least one embedded block and connecting the upper surface and the lower surface; at least one electronic component, disposed in the at least one opening of the at least one embedded block, wherein the first build-up circuit structure is electrically connected with the at least one electronic component; and at least one first conductive via, disposed in the at least one via of the at least one embedded block and electrically connecting the first build-up circuit structure and the at least one second build-up circuit structure.

2. The circuit carrier as claimed in claim 1, wherein the substrate further comprises: a core layer, having the top surface and the bottom surface; a first circuit layer, disposed on the top surface, wherein the first build-up circuit structure is electrically connected to the first circuit layer; a second circuit layer, disposed on the bottom surface, wherein the second build-up circuit structure is electrically connected to the second circuit layer; and at least one second conductive via, penetrating the core layer and electrically connected to the first circuit layer and the second circuit layer.

3. The circuit carrier as claimed in claim 1 further comprising: a dielectric material, wherein the at least one opening of the at least one embedded block is at least one second through hole, the dielectric material is filled in the at least one via and the at least one second through hole, and covers the at least one first conductive via located in the at least one via and the at least one electronic component located in the at least one second through hole.

4. The circuit carrier as claimed in claim 1, wherein the first build-up circuit structure comprises a plurality of dielectric layers, a plurality of circuit layers and a plurality of via holes, the plurality of dielectric layers and the plurality of circuit layers are alternately stacked, the plurality of via holes are electrically connected to two adjacent circuit layers of the plurality of circuit layers, the plurality of circuit layers are electrically connected to the substrate through the plurality of via holes, and the at least one second conductive through hole is electrically connected to a plurality of pads of the fine redistribution structure and an outmost circuit layer of the plurality of circuit layers, and at least one layer of the dielectric layers is a photosensitive dielectric layer or an Ajinomoto build-up film.

5. The circuit carrier as claimed in claim 1, wherein the second build-up circuit structure comprises a plurality of dielectric layers, a plurality of circuit layers and a plurality of via holes, the plurality of dielectric layers and the plurality of circuit layers are alternately stacked, the plurality of via holes are electrically connected to two adjacent circuit layers of the plurality of circuit layers, and the plurality of circuit layers are electrically connected to the substrate through the plurality of via holes.

6. The circuit carrier as claimed in claim 5, further comprising:
a solder mask layer, disposed on the second build-up circuit structure, covering an outmost dielectric layer of the plurality of dielectric layers and exposing a portion of an outmost circuit layer of the plurality of circuit layers; and
a plurality of solder balls, disposed on the outmost circuit layer exposed by the solder mask layer.

7. The circuit carrier as claimed in claim 1, wherein the fine redistribution structure comprises a plurality of redistribution circuits, a plurality of via holes, a plurality of dielectric layers, and a plurality of pads, and the plurality of redistribution circuits and the plurality of dielectric layers are alternately stacked, the plurality of via holes are electrically connected to adjacent two redistribution circuits of the plurality of redistribution circuits, the plurality of pads are electrically connected to the plurality of redistribution circuits through the plurality of via holes, and at least one layer of the dielectric layers is a photosensitive dielectric layer.

8. The circuit carrier as claimed in claim 1, wherein the line width and the line spacing of the fine redistribution structure are respectively less than 1 micrometer.

9. A package structure, comprising: a circuit carrier, comprising: a substrate, having a top surface and a bottom surface opposite to each other wherein the substrate is a dielectric substrate, and further comprises at least one through cavity penetrating the dielectric substrate and connecting the top surface and the bottom surface, at least one first through hole, at least one first conductive through hole, and a dielectric material layer, the at least one first through hole penetrates through the dielectric substrate, an aperture of the at least one through cavity is greater than an aperture of the at least one first through hole, the at least one first conductive through hole is disposed in the at least one first through hole, and the dielectric material layer is disposed in the at least one through hole to fill a gap between the at least one first conductive through hole and the dielectric substrate; a first build-up circuit structure, disposed on the top surface of the substrate and electrically connected to the substrate; a second build-up circuit structure, disposed on the bottom surface of the substrate and electrically connected to the substrate; a fine redistribution structure, directly attached on the first build-up circuit structure, wherein a line width and a line spacing of the fine redistribution structure are smaller than a line width and a line spacing of the first build-up circuit structure; at least one second conductive through hole, penetrating the fine redistribution structure and a portion of the first build-up circuit structure and electrically connected to the fine redistribution structure and the first build-up circuit structure; at least one embedded block, fixed in the at least one through cavity, wherein the at least one embedded block comprises an upper surface and a lower surface opposite to each other, at least one opening, and at least one via penetrating through the at least one embedded block and connecting the upper surface and the lower surface; at least one electronic component, disposed in the at least one opening of the at least one embedded block, wherein the first build-up circuit structure is electrically connected with the at least one electronic component; and at least one first conductive via, disposed in the at least one via of the at least one embedded block and electrically connecting the first build-up circuit structure and the at least one second build-up circuit structure; and at least one chip, disposed on the fine redistribution structure of the circuit carrier and electrically connected to the circuit carrier.

10. The package structure as claimed in claim 9, wherein the substrate further comprises:
   a core layer, having the top surface and the bottom surface;
   a first circuit layer, disposed on the top surface, wherein the first build-up circuit structure is electrically connected to the first circuit layer;
   a second circuit layer, disposed on the bottom surface, wherein the second build-up circuit structure is electrically connected to the second circuit layer; and
   at least one conductive via penetrating the core layer and electrically connected to the first circuit layer and the second circuit layer.

11. The package structure as claimed in claim 9, wherein the circuit carrier further comprising: a dielectric material, wherein the at least one opening of the at least one embedded block is at least one second through hole, the dielectric material is filled in the at least one via and the at least one second through hole, and covers the at least one first conductive via located in the at least one via and the at least one electronic component located in the at least one second through hole.

12. The package structure as claimed in claim 9, wherein the first build-up circuit structure comprises a plurality of dielectric layers, a plurality of circuit layers and a plurality of via holes, the plurality of dielectric layers and the plurality of circuit layers are alternately stacked, the plurality of via holes are electrically connected to two adjacent circuit layers of the plurality of circuit layers, the plurality of circuit layers are electrically connected to the substrate through the plurality of via holes, and the at least one second conductive through hole is electrically connected to a plurality of pads of the fine redistribution structure and an outmost circuit layer of the plurality of circuit layers, and at least one layer of the dielectric layers is a photosensitive dielectric layer or an Ajinomoto build-up film.

13. The package structure as claimed in claim 9, wherein the second build-up circuit structure comprises a plurality of dielectric layers, a plurality of circuit layers and a plurality of via holes, the plurality of dielectric layers and the plurality of circuit layers are alternately stacked, the plurality of via holes are electrically connected to two adjacent circuit layers of the plurality of circuit layers, and the plurality of circuit layers are electrically connected to the substrate through the plurality of via holes.

14. The package structure as claimed in claim 13, wherein the circuit carrier further comprising:
   a solder mask layer, disposed on the second build-up circuit structure, covering an outmost dielectric layer of the plurality of dielectric layers and exposing a portion of an outmost circuit layer of the plurality of circuit layers; and
   a plurality of solder balls, disposed on the outmost circuit layer exposed by the solder mask layer.

15. The package structure as claimed in claim 9, wherein the fine redistribution structure comprises a plurality of redistribution circuits, a plurality of via holes, a plurality of dielectric layers, and a plurality of pads, and the plurality of redistribution circuits and the plurality of dielectric layers are alternately stacked, the plurality of via holes are electrically connected to adjacent two redistribution circuits of the plurality of redistribution circuits, the plurality of pads are electrically connected to the plurality of redistribution circuits through the plurality of via holes, and at least one layer of the dielectric layers is a photosensitive dielectric layer.

16. The package structure as claimed in claim 9, wherein the line width and the line spacing of the fine redistribution structure are respectively less than 1 micrometer.

17. The package structure as claimed in claim 9, further comprising:
   a plurality of solder balls, disposed between the at least one chip and the fine redistribution structure; and
   an underfill, disposed between the at least one chip and the fine redistribution structure and covering the plurality of solder balls.

* * * * *